(12) United States Patent
Mukherjee et al.

(10) Patent No.: US 7,292,964 B1
(45) Date of Patent: Nov. 6, 2007

(54) TRANSLATING OF GEOMETRIC MODELS INTO BLOCK DIAGRAM MODELS

(75) Inventors: Arnav Mukherjee, Newton, MA (US); Victor Chudnovsky, Brookline, MA (US); Jeff Wendlandt, Newton, MA (US); Nathan Brewton, Medford, MA (US)

(73) Assignee: The Mathworks, Inc., Natick, MA (US)

( * ) Notice: Subject to any disclaimer, the term of this patent is extended or adjusted under 35 U.S.C. 154(b) by 382 days.

(21) Appl. No.: 10/744,513

(22) Filed: Dec. 22, 2003

(51) Int. Cl.
G06F 17/50 (2006.01)

(52) U.S. Cl. ............ 703/1; 703/2; 703/6; 703/7; 703/22; 707/104.1; 707/100; 707/102; 707/103 Y; 715/853; 434/211; 345/420; 345/619; 345/440

(58) Field of Classification Search ............ 703/1, 703/2; 717/137; 345/419; 714/38; 434/211; 707/104.1; 715/853
See application file for complete search history.

(56) References Cited

U.S. PATENT DOCUMENTS

| | | | | |
|---|---|---|---|---|
| 3,927,948 | A * | 12/1975 | Cox et al. ............ | 356/496 |
| 5,625,575 | A * | 4/1997 | Goyal et al. ............ | 703/6 |
| 6,295,513 | B1 * | 9/2001 | Thackston ............ | 703/1 |
| 6,928,396 | B2 * | 8/2005 | Thackston ............ | 703/1 |
| 7,062,341 | B1 * | 6/2006 | Karaikurichi ............ | 700/97 |
| 7,149,677 | B2 * | 12/2006 | Jayaram et al. ............ | 703/22 |
| 2001/0027456 | A1 * | 10/2001 | Lancaster et al. ...... | 707/104.1 |
| 2002/0035450 | A1 * | 3/2002 | Thackston ............ | 703/1 |
| 2002/0120920 | A1 * | 8/2002 | Jayaram et al. ............ | 717/137 |
| 2002/0123812 | A1 * | 9/2002 | Jayaram et al. ............ | 700/98 |
| 2002/0127523 | A1 * | 9/2002 | Edic et al. ............ | 434/211 |
| 2002/0183986 | A1 * | 12/2002 | Stewart et al. ............ | 703/2 |
| 2002/0188622 | A1 * | 12/2002 | Wallen et al. ............ | 707/104.1 |
| 2003/0016216 | A1 * | 1/2003 | Hariya et al. ............ | 345/420 |
| 2003/0135846 | A1 * | 7/2003 | Jayaram et al. ............ | 717/137 |
| 2003/0154058 | A1 * | 8/2003 | Keener ............ | 703/2 |
| 2003/0204285 | A1 * | 10/2003 | Thomas et al. ............ | 700/182 |
| 2004/0046287 | A1 * | 3/2004 | Andino et al. ............ | 264/401 |
| 2004/0090472 | A1 * | 5/2004 | Risch et al. ............ | 345/853 |
| 2004/0153824 | A1 * | 8/2004 | Devarajan et al. ............ | 714/38 |
| 2004/0236550 | A1 * | 11/2004 | Edic et al. ............ | 703/2 |

(Continued)

OTHER PUBLICATIONS

Dynasim AB□□Dymola, Dynamic Modeling Laboratory, User's Manual□□Version 5.0□□1992-2002.*

(Continued)

*Primary Examiner*—Fred Ferris
*Assistant Examiner*—Cuong Van Luu
(74) *Attorney, Agent, or Firm*—Lahive & Cockfield LLP

(57) ABSTRACT

Methods and systems for translating models generated in one modeling environment into models that can be used in other modeling environments are disclosed. Models are created using different data formats in different modeling environments. These data formats are generally incompatible with each other. Therefore, the present invention provides a neutral data format that can store information relating to models generated in one modeling environment, and that can be used by other modeling environments to create their models. The present invention may export models created in one modeling environment into the neutral data format. The neutral data format may subsequently be imported into other modeling environments in which new models are generated using the information contained in the neutral data format. The present invention also provides animation of the newly generated models by animation clients via open animation interfaces that support multiple animation clients at a simultaneous time.

5 Claims, 10 Drawing Sheets

U.S. PATENT DOCUMENTS

| | | | |
|---|---|---|---|
| 2005/0038821 A1* | 2/2005 | Wallen et al. | 707/104.1 |
| 2005/0046624 A1* | 3/2005 | Jayaram et al. | 345/419 |
| 2005/0169512 A1* | 8/2005 | Fang et al. | 382/141 |
| 2005/0234687 A1* | 10/2005 | Sakairi et al. | 703/2 |

OTHER PUBLICATIONS

M. Otter, H. Elmpvist, F. E. Cellier—Modeling of Multibody Systems with the Object-Oriented Modeling Language Dymola—.*

Mike Dempsey—Modelica, Proceedings of the 3rd International Modelica conference, pp. 115-124—Nov. 3-4, 2004.*

Mattsson et al—Dynamic selection of States in Dymola. Modelica Workshop 2000 Proceedings, pp. 61-67—Modelica Workshop 2000, Oct. 23-24, 2000, Lund, Sweden.*

M. Kezunovic, B. Kasztenny—New Simulink Libraries for Modeling Digital Protective Relays and Evaluating Their Performance Under Fault Transients—International Conference on Power System Transients-IPST, 1999—eppe.tamu.edu.*

Dennis Assanis et al.—Validation and Use of Simulink Itegrated, High Fidelity, Engine-In-Vehicle Simulation of the International Class VI Truck—Society of Automotive Engineers, Inc., 2001-01-0288.*

* cited by examiner

| File Name | CAD File Type |
|---|---|
| 530 — robot.<ASSEMBLYFILETYPE> | Assembly |
| 540 — grip.<ASSEMBLYFILETYPE> | Subassembly (flexible) |
| 550 { base.<PARTFILETYPE><br>forearm.<PARTFILETYPE><br>upperarm.<PARTFILETYPE><br>wrist.<PARTFILETYPE> | Parts (main assembly) |
| 560 { fingertips.<PARTFILETYPE> (twice)<br>firstfingerlink.<PARTFILETYPE><br>firstfingerlinkL.<PARTFILETYPE><br>metacarpal.<PARTFILETYPE><br>secondfingerlink.<PARTFILETYPE> (twice) | Parts (subassembly) |

Fig. 5B

```
         ⎧ <?xml version="1.0" ?>
         │ - <PhysicalModelingXMLFile>                         ↙ 130
         │   <formatVersion>"1.0"</formatVersion>
   810 ⎨   <creationDate>"03/18/03||11:08:05"</creationDate>
         │   <createdBy>" "</createdBy>
         ⎩   <modelName>"robot"</modelName>
   820 — - <subsystem>
           - <Subsystem>
             <name>"robot"</name>
             <status>" "</status>
   830 — - <bodies>
         ⎧   + <Body>
         │   + <Body>
   831 ⎨   + <Body>
         │   + <Body>
         ⎩   </bodies>
   840 — - <joints>
         ⎧   + <SimpleJoint>
         │   + <SimpleJoint>
         │   + <SimpleJoint>
   841 ⎨   + <SimpleJoint>
         │   + <SimpleJoint>
         │   + <SimpleJoint>
         ⎩   </joints>
   850 — - <grounds>
             + <Ground>
             </grounds>
   860 — - <subsystems>
             + <Subsystem>
   861 —   </subsystems>
             </connectionPorts />
             <id>0</id>
           </Subsystem>
         </subsystem>
       </PhysicalModelingXMLFile>
```

*Fig. 8*

TRANSLATING OF GEOMETRIC MODELS INTO BLOCK DIAGRAM MODELS

FIELD OF THE INVENTION

The present invention relates generally to graphical modeling environments and more particularly to methods and systems for translating models generated in geometric modeling environments into models that can be used in block diagram modeling environments.

BACKGROUND OF THE INVENTION

Various classes of block diagrams describe computations that can be performed on application specific computational hardware, such as a computer, microcontroller, FPGA, and custom hardware. Classes of such block diagrams include time-based block diagrams, such as those found within Simulink®, from The MathWorks, Inc. of Natick, Mass., state-based and flow diagrams, such as those found within Stateflow®, from The MathWorks, Inc. of Natick, Mass., and data-flow diagrams. A common characteristic among these various forms of block diagrams is that they define semantics on how to execute the diagram.

Historically, engineers and scientists have utilized time-based block diagram models in numerous scientific areas such as Feedback Control Theory and Signal Processing to study, design, debug, and refine dynamic systems. Dynamic systems, which are characterized by the fact that their behaviors change over time, are representative of many real-world systems. Time-based block diagram modeling has become particularly attractive over the last few years with the advent of software packages, such as Simulink®. Such packages provide sophisticated software platforms with a rich suite of support tools that makes the analysis and design of dynamic systems efficient, methodical, and cost-effective.

Geometric modeling environments, such as Computer-aided design (CAD) environments, enable users to model machines geometrically into assemblies. Although the geometric modeling environments are useful for the physical modeling of machines, it is difficult to design control systems that can be incorporated into the geometric model of the machines. The block diagram modeling environments, such as Simulink®, use a schematic approach to model control systems around mechanical devices and simulate the dynamics of the mechanical devices with the control systems. Therefore, it is desired to translate models generated in geometric modeling environments into models that can be utilized in block diagram modeling environments.

SUMMARY OF THE INVENTION

The present invention provides methods and systems for translating models generated in one modeling environment into models that can be used in other modeling environments. In other words, the present invention introduces models generated in different modeling environments into a modeling environment in which users want to use the models. Because models are built up using different data formats in different modeling environments, models generated in one modeling environment may not be used in other modeling environments. Therefore, some embodiments of the present invention provides a neutral data format which models generated in one modeling environment can be exported into, and which other modeling environments can import to create corresponding models. Models generated in any modeling environments may be exported in the neutral data format. The neutral data format may be imported into any modeling environments in which new models are generated using the information contained in the neutral data format.

In one aspect of the present invention, a method is provided for translating a model generated in a geometric modeling environment into a model in a block diagram modeling environment. A geometric model is created in the geometric modeling environment. The geometric model is then exported into a neutral data format. The neutral data format is subsequently imported into the block diagram modeling environment. Finally, a block diagram model is generated in the block diagram modeling environment based on the data contained in the neutral data format.

In another aspect of the present invention, a method is provided for translating a first model generated in the geometric modeling environment into a second model in a different modeling environment. A first model is created in the geometric modeling environment. The first model includes information on rigid parts of the first model and information on mates between the rigid parts of the first model. The first model is exported into a neutral data format. The information on parts of the first model and the information on mates between the parts of the first model are also exported to the neutral data format. The second model is built using the neutral data format in the different modeling environment.

In still another aspect of the present invention, a method is provided for translating a first model generated in a different modeling environment into a second model in a block diagram modeling environment. A neutral data format is imported into the block diagram modeling environment. The neutral data format includes information on rigid parts of the first model and information on mates between the rigid parts of the first model generated in the different modeling environment. A block diagram model is created based on the data contained in the neutral data format.

In yet still another aspect of the present invention, a medium is provided for holding a neutral data format used for translating a first model generated in a first modeling environment into a second model in a second modeling environment. The neutral data format has first data fields for storing information on rigid parts of the first model. The first data fields are used to build first elements in the second model that represent the rigid parts of the first model. The neutral data format also has second data fields for storing information on mates between the rigid parts of the first model. The second fields are used to build second elements in the second model that represent mates between the parts of the first model. The first and second fields are organized in a hierarchical tree structure that is consistent with a hierarchical tree structure of the parts and mates in the first model. In an illustrative embodiment, the second elements may include joint blocks in block diagram environments and the second data fields may include information on the joint blocks into which the mate information is translated. The information on the joint blocks may represent the degrees of freedom (DoFs) of the rigid parts in the first model.

The neutral data format is subsequently imported into the block diagram modeling environment. A block diagram model is created based on the information contained in the neutral data format, such as the information relating to the rigid parts of the CAD model and to the mates between the rigid parts of the CAD model. One of ordinary skill in the art will appreciate that although the illustrative embodiment is described in connection with models created in CAD environments, the present invention is not limited to the CAD models, but rather applies to models created in other modeling environments including multi-body simulation environments, such as ADAMS and VisualNatran 4D, both from MSC.Software Corp. of Santa Ana, Calif. One of ordinary skill in the art will also appreciate that the block diagram modeling environments are also illustrative modeling environments and the neutral data format may be imported into other types of modeling environments.

By providing a neutral data format, the present invention enables models created in one modeling environment to be translated into models that can be used in other modeling environments. In particular, by translating models created in geometric modeling environments into models in block diagram modeling environments, the present invention enables users to efficiently design control systems for the models created in the geometric modeling environments. Additionally, the models created in the geometric modeling environments can be dynamically simulated in the block diagram modeling environments.

BRIEF DESCRIPTION OF THE DRAWINGS

The aforementioned features and advantages, and other features and aspects of the present invention, will become better understood with regard to the following description and accompanying drawings, wherein:

FIG. 5B is an exemplary file structure of a robot arm model depicted in FIG. 5A;

FIG. 8 shows an exemplary XML format provided in the illustrative embodiment of the present invention;

DETAILED DESCRIPTION

Figure 1:
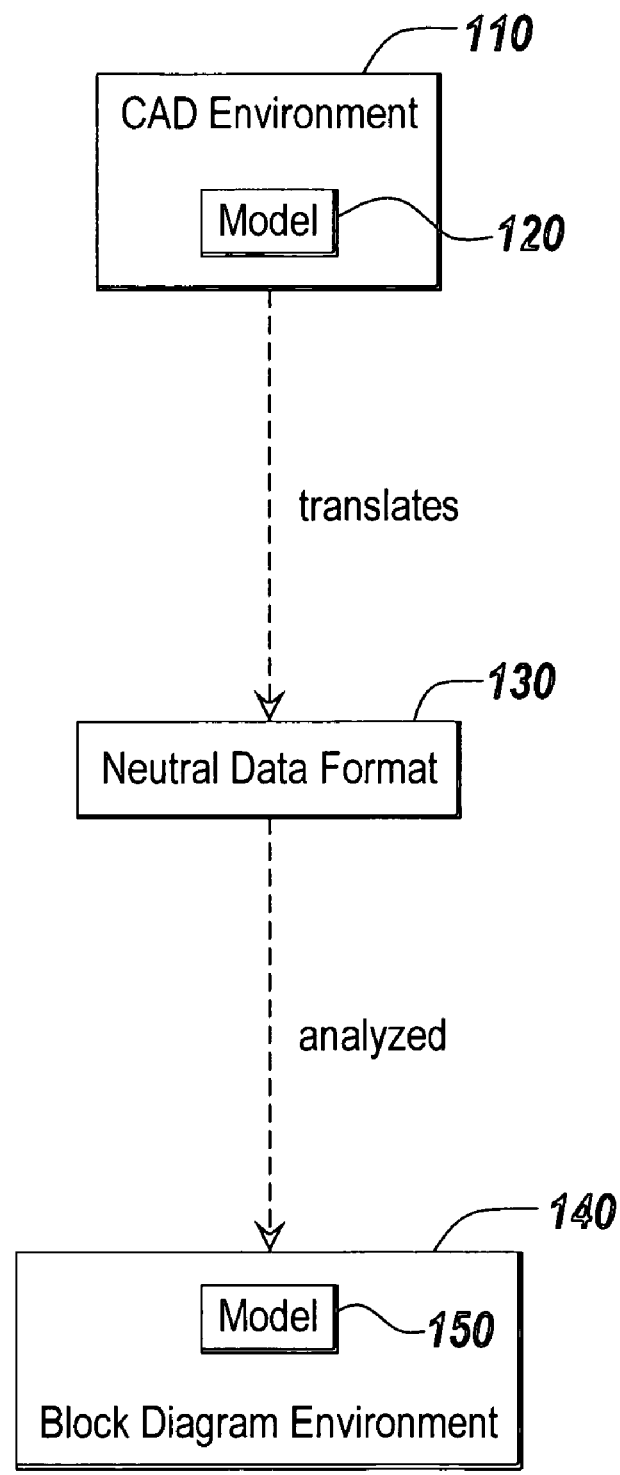
FIG. 1 depicts an illustrative embodiment of the present invention in which a model generated in a CAD environment is translated into a block diagram model in a block diagram modeling environment.

The illustrative embodiment of the present invention concerns the translation of models created in Computer Aided Design (CAD) environments into models in block diagram modeling environments. CAD environments are widely utilized to design target objects, including mechanical, electrical, and architectural objects. In particular, CAD environments provide useful environments for users to model physical objects, such as machines, into geometric assemblies. The CAD environments may be provided by software tools, such as tools from SolidWorks Corporation of Concord, Mass., and CATIA from Dassault Systèmes of France. Block diagram modeling environments represent real systems as a collection of blocks interconnected by lines. Blocks are entities of models that perform given functions in the models. Exemplary block diagram modeling environments are found in Simulink® and SimMechanics, both from The MathWorks, Inc. of Natick, Mass. Nevertheless, those who skilled in the art will appreciate that the present invention may be practiced in other block diagram modeling environments, including but not limited to LabVIEW from National Instruments Corporation of Austin, Tex.

For illustrative purposes only in the discussion below, the illustrative embodiment will be described relative to an implementation that uses Simulink® and SimMechanics.

"Block diagram" will be used hereinafter as described above in the Background of the Invention.

Simulink® provides tools for modeling and simulating a variety of dynamic systems in one integrated, graphical environment. Simulink® enables users to design a block diagram for a target system, simulate the system's behavior, analyze the performance of the system, and refine the design of the system. Simulink® allows users to design target systems through a user-interface that allows drafting of block diagram models of the target systems. All of the blocks in a block library provided by Simulink and other programs are available to users when the users are building the block diagram of the target systems. Individual users may be able to customize this model block to: (a) reorganize blocks in some custom format, (b) delete blocks they do not use, and (c) add custom blocks they have designed. The blocks may be dragged through some human-machine interface (such as a mouse or keyboard) from the block library on to the window (i.e., model canvas). Simulink® includes a block diagram editor that allows users to perform such actions as draw, edit, annotate, save, and print out block diagram representations of target systems. The block diagram editor is a graphical user interface (GUI) component that allows drafting of block diagram models by users. In Simulink®, there is also a textual interface with a set of commands that allow interaction with the graphical editor. Using this textual interface, users may write special scripts that perform automatic editing operations on the block diagram. Simulink® also allows users to simulate the designed target systems to determine the behavior of the systems. Simulink® includes a block diagram execution engine that carries out the task of compiling and linking the block diagram to produce an "in-memory executable" version of the model that is used for generating code and/or simulating a block diagram model.

SimMechanics provides tools for modeling mechanical components of physical systems in block diagram modeling environments. SimMechanics provides environments in which users can model and simulate geometric configurations and responses to mechanical stimuli. SimMechanics contains blocks that correspond to physical components, such as bodies, joints, constraints, coordinate systems, actuators, and sensors. The blocks in SimMechanics enable users to model complicated mechanical subsystems found in most physical systems, such as ground vehicles, aircraft, spacecraft, and manufacturing equipment. Within the Simulink® environment, users can use SimMechanics to define and easily modify system's physical parameters, including the position, orientation, and motion of the mechanical components. SimMechanics enables users to design corresponding control systems in Simulink® environment. SimMechanics extends the control design capabilities of Simulink® into the mechanical domain. SimMechanics and Simulink® together provide an integrated environment for modeling multi-domain systems and controllers and evaluating overall system performance, which allows the entire machine/controller system to be modeled in a single environment.

The illustrative embodiment of the present invention translates a model generated in a CAD environment into a model in a block diagram modeling environment. The CAD model may include information on geometric representation of physical objects, which may relate to rigid parts of the CAD model and to mates between the rigid parts. The CAD model is exported into a neutral data format. Information relating to the parts of the CAD model and to the mates between the parts is described in the neutral data format. The information on the mates between rigid parts describes how the rigid parts mate to each other and determines how the rigid parts are brought into an assembly. The types of the mates may differ depending on the CAD environments in which the CAD model is created. In the illustrative embodiment, the mate information is translated into information representing the degrees of freedom (DoFs) of the rigid parts in the CAD model. The information on the DoFs of the rigid parts in the CAD model is stored in a neutral data format, which may be used to build up corresponding joint blocks in the block diagram modeling environment. The joint blocks may represent one or more mechanical DoFs that one body block has relative to another body block. Each of the body blocks may represent one of the rigid parts in the CAD model.

The neutral data format is subsequently imported into the block diagram modeling environment. A block diagram model is created based on the information contained in the neutral data format, such as the information relating to the rigid parts of the CAD model and to the mates between the rigid parts of the CAD model. One of ordinary skill in the art will appreciate that although the illustrative embodiment is described in connection with models created in CAD environments, the present invention is not limited to the CAD models, but rather applies to models created in other modeling environments including multi-body simulation environments, such as ADAMS and VisualNatran 4D, both from MSC.Software Corp. of Santa Ana, Calif. One of ordinary skill in the art will also appreciate that the block diagram modeling environments are also illustrative modeling environments and the neutral data format may be imported into other types of modeling environments.

FIG. 1 depicts an illustrative embodiment of the present invention in which a model generated in a CAD environment is translated into a model in a block diagram modeling environment. A model 120 is created and/or loaded (i.e. loaded from memory) in a CAD environment 110. The model 120 includes geometric representations of physical objects, such as a machine. The model 120 will be described below in more detail for an illustrative example with reference to FIGS. 5A and 5B. The model 120 generated in the CAD environment 110 may not be used in other modeling environments, such as a block diagram modeling environment 140, that require different data formats for models. In order to use the model 120 in other modeling environments, the illustrative embodiment of the present invention translates the model 120 into a neutral data format 130. The neutral data format 130 contains information extracted from the model 120. The neutral data format 130 may include any data format that can be accessed by both of the environments 110 and 140. An exemplary neutral data format 130 may be described using Markup Languages, such as Extensible Markup Language (XML). One of ordinary skill in the ordinary art will appreciate that the neutral data format 130 may be described using other markup languages, such as Hypertext Mark-up Language (HTML) and Standard Generalized Mark-up Language (SGML). Further, the neutral data format need not be a markup language format. For example, the neutral data format could be a text format or other canonical format. The XML format will be described below in more detail with reference to FIG. 8.

The neutral data format 130 is imported into another modeling environment, such as block diagram modeling environment 140. The block diagram modeling environment 140 reads and analyzes the neutral data format 130 to generate a block diagram model 150 based on the information contained in the neutral data format 130. One of ordinary skill in the art will appreciate that the CAD environment 110 and block diagram modeling environment 140 are exemplary modeling environments in which the illustrative embodiment of the present invention is practiced and other embodiments may be practiced with models of other modeling environments.

Figure 2:
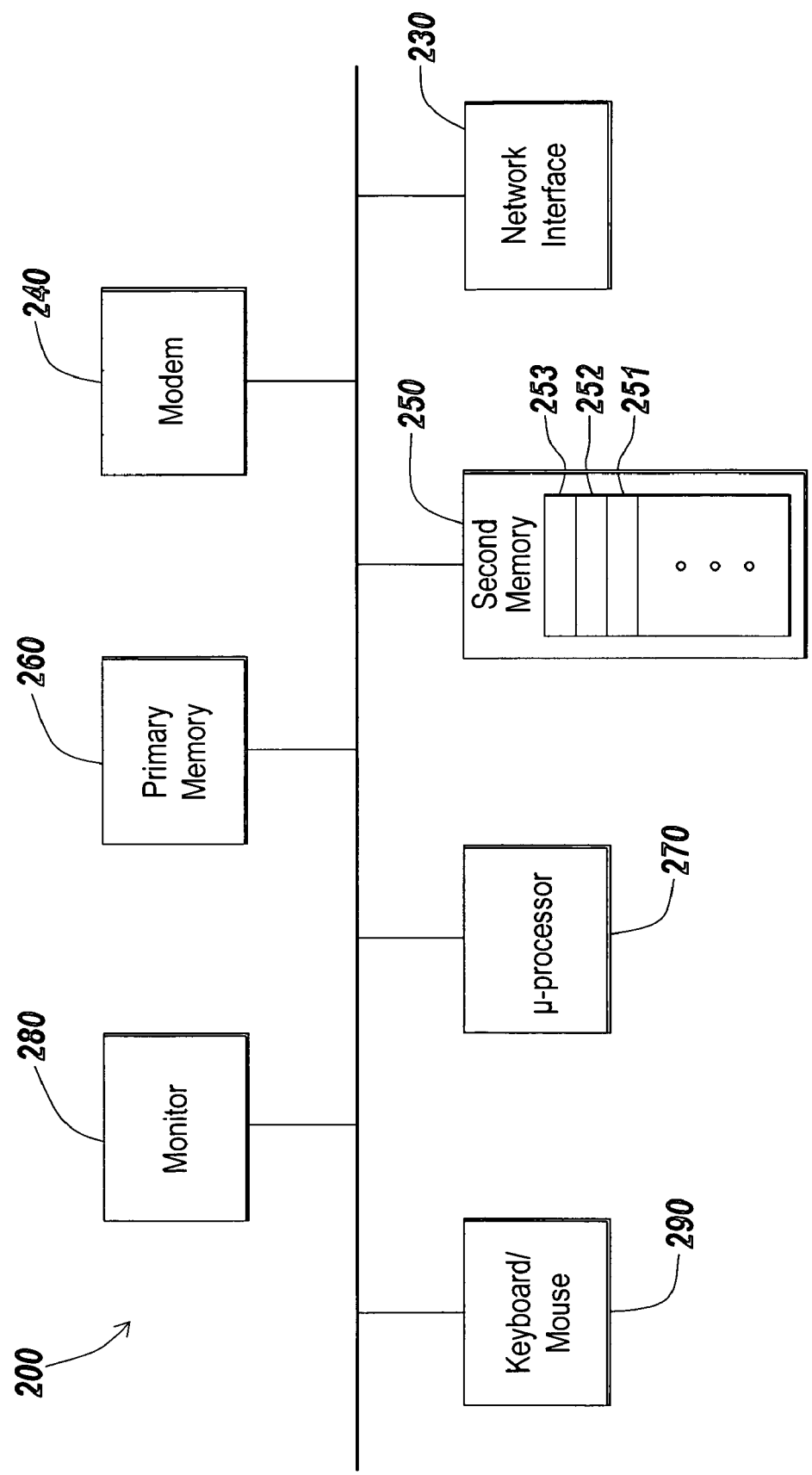
FIG. 2 is an exemplary electronic device suitable for practicing the illustrative embodiment of the present invention depicted in FIG. 1.

FIG. 2 is an exemplary electronic device 200 suitable for practicing the illustrative embodiment of the present invention. The electronic device 200 includes a network interface 230, a MODEM 240, a secondary memory 250, a primary memory 260, a microprocessor 270, a monitor 280 and a keyboard/mouse 290. One of ordinary skill in the art will appreciate that the CAD environment 110 and the block diagram modeling environment 140 may be provided in a same electronic device 200 or in separate electronic devices 200. One of ordinary skill in the art will also appreciate that the CAD environment 110 and the block diagram modeling environment 140 provided in separate electronic devices 220 may be connected through communication networks using the MODEM 240 and network interface 230. The network interface 230 and the MODEM 240 enable the electronic device 200 to communicate with other electronic devices through communication networks, such as Internet, intranet, LAN (Local Area Network), WAN (Wide Area Network) and MAN (Metropolitan Area Network). The communication facilities may support for the distributed implementations of the present invention. The microprocessor 270 controls each component of the electronic device 200 to run software tools for the modeling environments 110 and 140 properly. The electronic device 200 receives the input data necessary for translating a model 120 into a block diagram model 140, such as the input data for setting a translator (see FIG. 3), through the keyboard/mouse 290. The electronic device 200 displays in the monitor 280 the models 120 and/or 140 generated in each of the modeling environments 110 and 140. The primary memory 260 fetches from the secondary memory 250 and provides to the microprocessor 270 the codes that need to be accessed by the microprocessor 270 to operate the electronic device 200 and to run the modeling environments 110 and 140. The secondary memory 250 usually contains software tools for applications. The secondary memory 250 includes, in particular, code 251 for the CAD environment 110, code 252 for the neutral data format 130, and code 253 for the a block diagram modeling environment 140.

Figure 3:
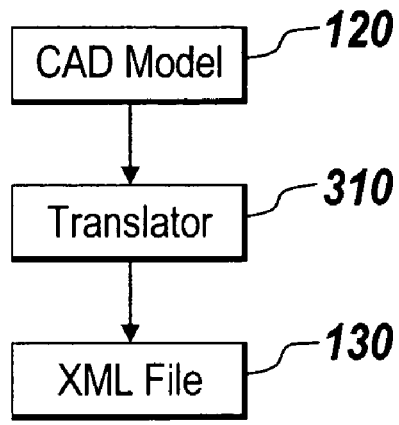
FIG. 3 depicts a translator that translates a CAD model into an XML format in the illustrative embodiment of the present.

FIG. 3 depicts an illustrative embodiment of the present invention in which a translator 310 translates a CAD model 120 into an XML file. The CAD model 120 is exported (i.e. translated) into the XML file by the translator 310. The translator 310 may be integrated with the CAD environment 110 in the illustrative embodiment of the present invention. One of ordinary skill in the art will appreciate that the translator 310 may stand alone in other embodiments of the present invention. One of ordinary skill in the art will also appreciate that the translator 310, alternatively, may be integrated with the block diagram modeling environment 140 that imports the XML file. The operation of the translator 310 will be described below in more detail with reference to FIGS. 4 through 8

Figure 4:
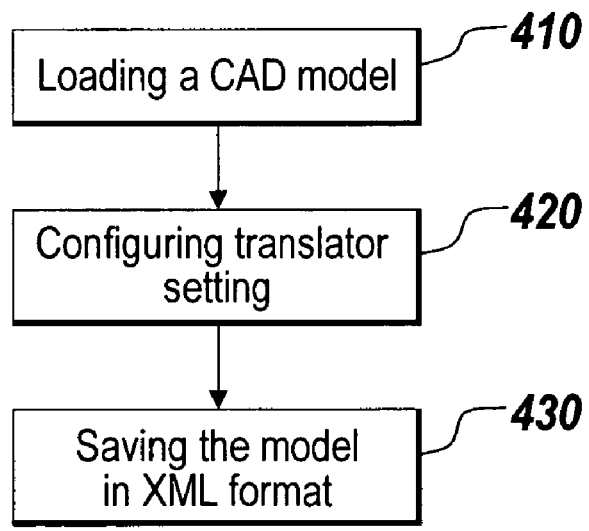
FIG. 4 shows an exemplary operation for exporting a CAD model into an XML format depicted in FIG. 3.
Figure 5A:
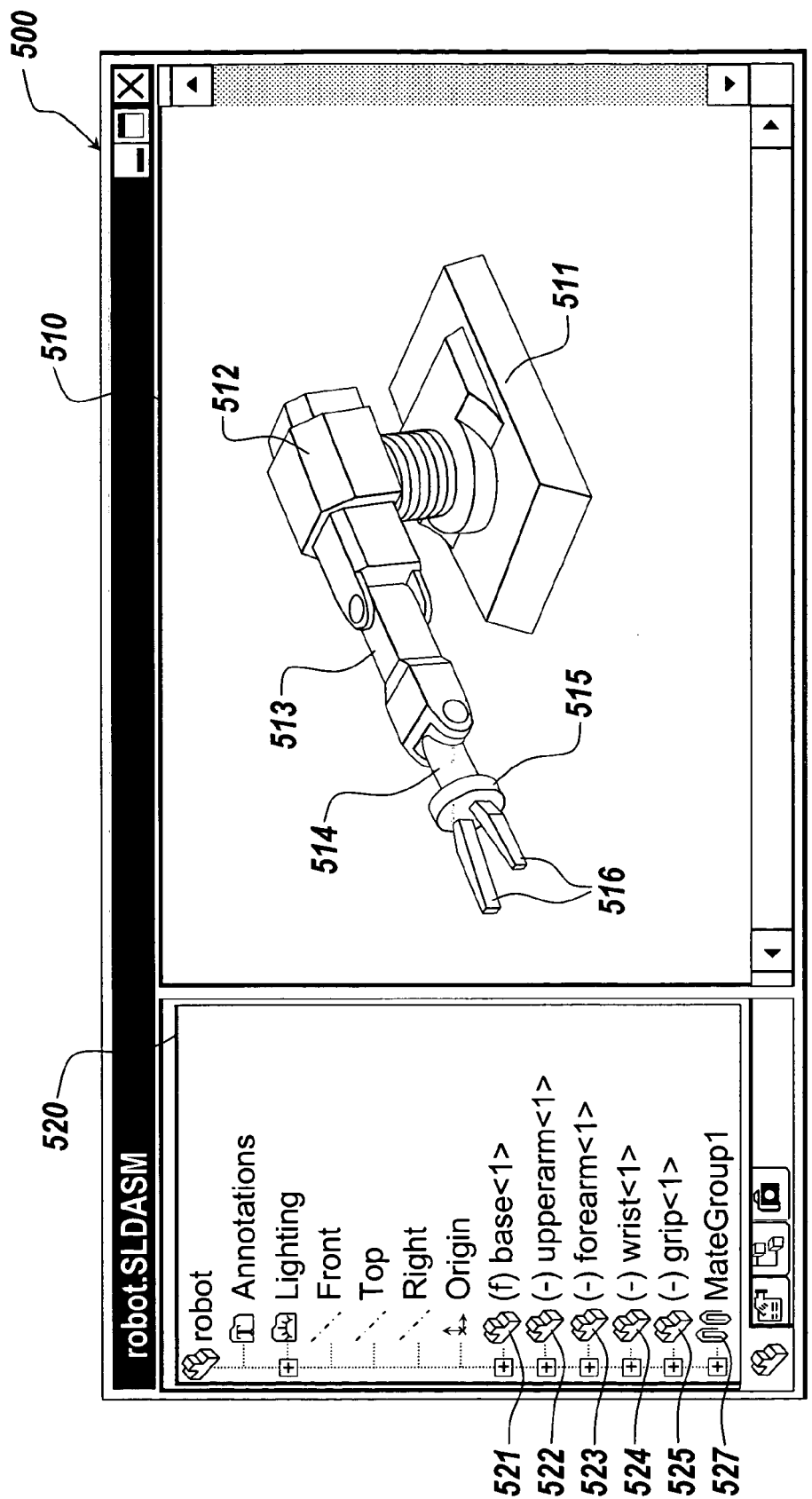
FIG. 5A is an exemplary model window displaying a CAD model for a robot arm in the illustrative embodiment of the present.

FIG. 4 shows an exemplary operation for exporting the CAD model 120 into the XML file. The CAD model 120 is created or loaded in the CAD environment 110 (step 410). An exemplary CAD model for a robot arm is shown in FIG. 5A. In this example case, the robot arm model may be created or loaded in a model window 500 that includes two panes: a right pane 510 for displaying three-dimensional geometry of the robot arm and a left pane 520 for displaying information relating to the parts and mates of the robot arm model. The robot arm model includes multiple parts, multiple mates and one subassembly. As shown in the right pane 510, the robot arm model includes four parts: a base 511, an upper arm 512, a forearm 513 and a wrist 514. The robot arm model also includes a subassembly, designated as a grip 515, that includes two fingers 516. The upper arm 512 can move relative to the base 511 by pitching, yawing and rolling. The forearm 513 can yaw relative to the upper arm 512. The wrist 514 can pitch relative to the forearm 513. The grip 515 can rotate about its symmetry axis. Each finger 516 in the grip 515 can open and close separately. The hierarchical structure of the robot arm model is displayed on the left pane 520 in which the robot arm model includes a base 521, an upper arm 522, a forearm 523, a wrist 524 and a grip 525 on the first level of the hierarchical structure.

The robot arm model also includes a group of mates, MateGroup1 527, that includes information on the mates between the parts on the first level. The mates information specifies how parts can move with respect to each other. The mates information may also define the constraints of a part relative to the other part. The mates information determines the degrees of freedom of the model. The grip subassembly may include its own parts on the second level of the hierarchical structure (not shown in FIG. 5A). The grip subassembly may also include its own group of mates.

FIG. 5B illustrates the file structures of the robot arm model that is consistent with the hierarchical structure of the robot arm model displayed in FIG. 5A. The robot arm model includes a main assembly file 530 on a highest level. The main assembly includes four part files 550 for the base 511, forearm 513, upper arm 512 and wrist 514, and one subassembly file 540 for the grip 515. The subassembly includes five part files 560.

Figure 6:
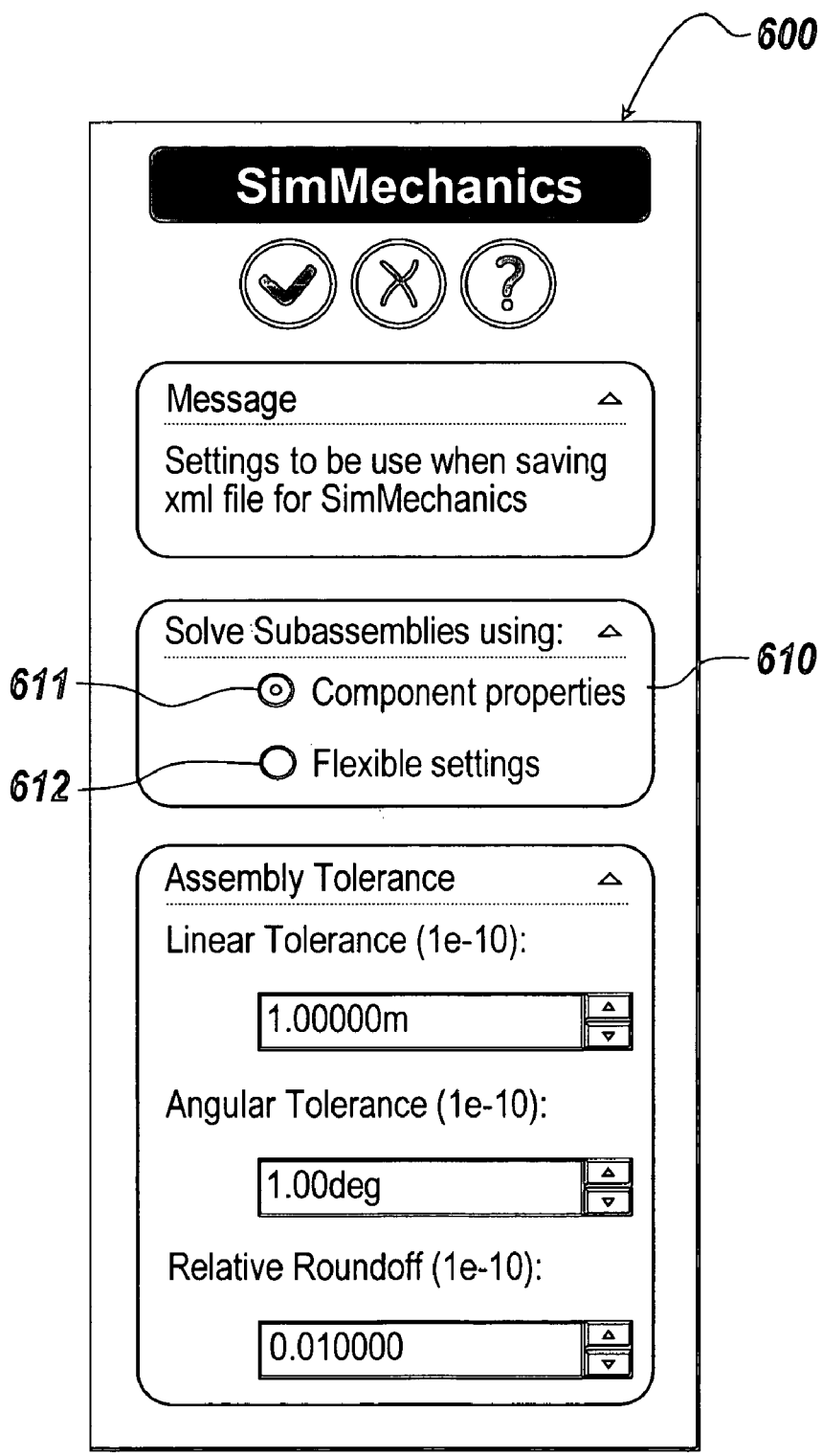
FIG. 6 is an illustrative graphical user interface for configuring the setting of a translator depicted in FIG. 3.

After creating or loading the robot arm model, users can configure the setting of the translator 310 (FIG. 3) using a user interface (step 420 in FIG. 4). FIG. 6 is an exemplary graphical user interface provided for configuring the setting of the translator 310 in the illustrative embodiment of the present invention. The user interface 600 may be provided in response to users' selection of an option provided in the model window 500 (FIG. 5A). The user interface 600 may provide users with an option 610 to configure subassemblies of the robot arm model. If users choose component properties 611, the translator 310 treats each subassembly of the robot arm model according to the individual rigid or flexible setting in the CAD environment 110. If users choose flexible settings 612, the translator 310 treats all subassemblies of the robot arm model, regardless of the individual settings in the CAD environment 110, flexible. Flexible subassemblies are deemed to have distinct parts that can move relative to one another according to the mates. In comparison, rigid subassemblies are considered to have distinct parts constrained to move as a single body.

Figure 7:
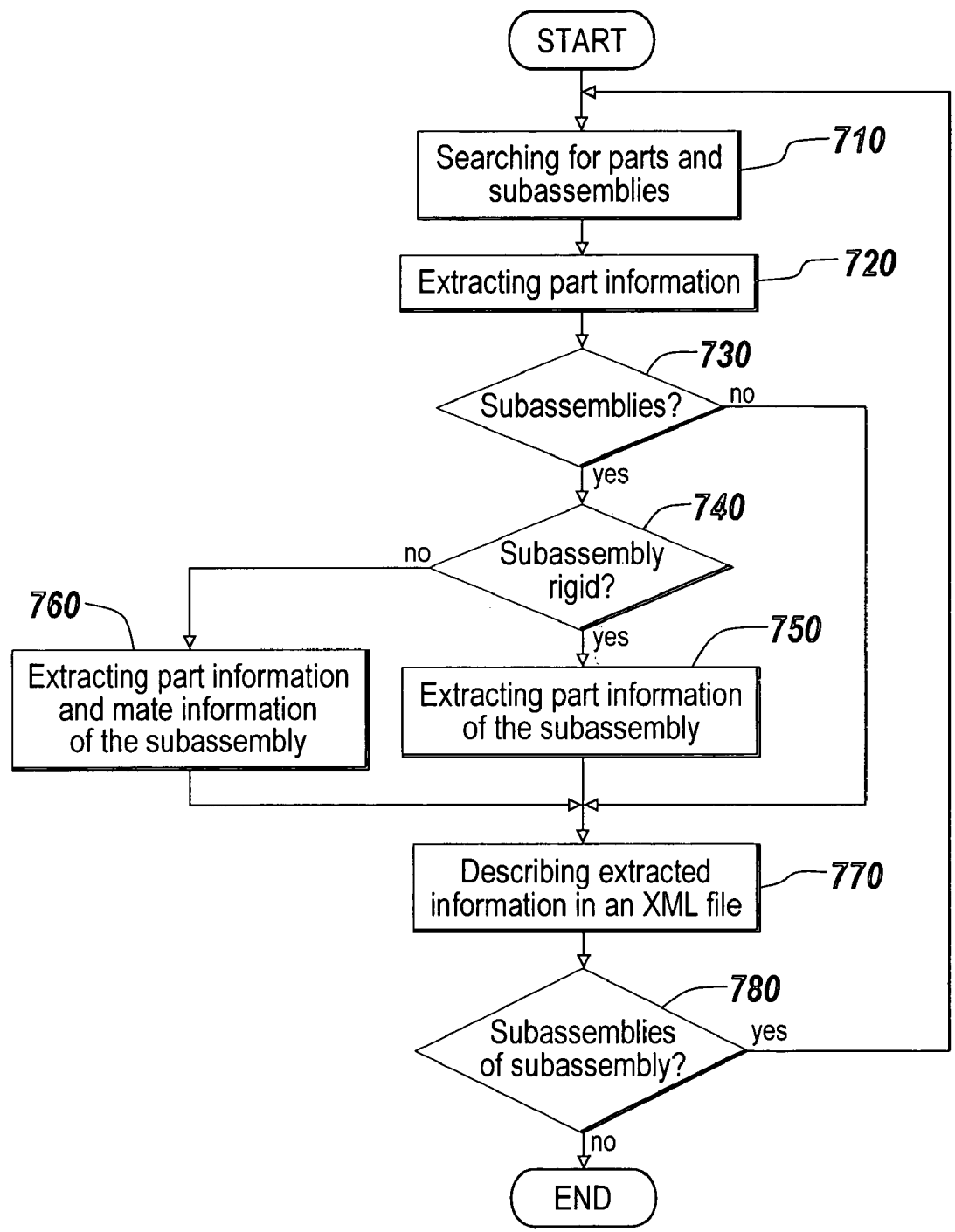
FIG. 7 shows an exemplary operation of a translator depicted in FIG. 3 for exporting a robot arm model into an XML format.

After configuring the setting of the translator 310, users can save the robot arm model in an XML file that serves as the neutral data format (step 430 in FIG. 4). If the users save the robot arm model into the XML file, the translator 310 exports the robot arm model into the XML file. FIG. 7 shows an exemplary operation of the translator 310 for exporting the robot arm model into the XML file. The translator 310 searches for the parts and subassemblies of a main assembly in the hierarchy of the robot arm model (step 710). One of ordinary skill in the art will appreciate that the search may be conducted in various ways, such as in a depth-first method. Information on the rigid parts of the main assembly is extracted, for example, from part files 550 shown in FIG. 5B (step 720), and stored in an XML file 130 that contains descriptive tags (step 770). The information on the rigid parts may include but not limited to mass, inertial, volume and surface area of the parts. The information also includes geometric information of the rigid parts. The translator 310 checks whether the main assembly includes subassemblies (step 730) and the subassemblies found in the main assembly are rigid or flexible (step 740). If the subassemblies are rigid, which means that a subassembly is treated as a single rigid body, the translator 310 extracts information on the rigid parts of the subassemblies from the part files 560 (step 750) and stored the extracted information in the XML file 130 (step 770). If the subassemblies are flexible, the translator 310 extracts information on the rigid parts of the subassemblies and on the group of mates in the subassemblies (step 760). The extracted information is stored in the XML file 130 (step 770). In the flexible settings of the translator 310 shown in FIG. 6, steps 740 and 750 may be skipped. The subassemblies may include other subassemblies. If subassemblies have other subassemblies (step 780), the steps 710 through 770 may be repeated with respect to the subassemblies of subassemblies because the main assembly may be treated as a top level subassembly. One of ordinary skill in the art will appreciate that the extracted information may be stored in multiple XML files. One of ordinary skill in the art will also appreciate that the extracted information need not be stored at the same location.

The translator 310 describes the robot arm model in an XML file using the information extracted from the robot arm model. FIG. 8 shows an exemplary portion of an XML file 130 for the robot arm example. The XML file 130 may include a top level object 810 defining an XML file 130 that contains one physical model. The top level object 810 may also include information on a format version, a creation date and a model name see FIG. 8). The XML file includes a top level subsystem 820 for the model that corresponds to the main assembly of the robot arm model. The subsystem 820 may include elements, such as <bodies> 830, <joints> 840, <grounds> 850 and <subsystems> 860.

The <bodies> element 830 may contain parts information of rigid parts in the robot arm model. The information contained in the <bodies> element is used to build body blocks in a block diagram modeling environment 140, which will be described in more detail below with reference to FIGS. 9 and 10. The <bodies> element 830 includes multiple <Body> elements 831 each of which corresponds to a rigid part in the robot arm model. A portion of an exemplary XML file for a <Body> element 831 in the <bodies> element 830 is provided as follows.

```
<Body>
<name>"upperarm-1"</name>
<status>""</status>
<mass>0.801581</mass>
<massUnits>"kg"</massUnits>
<inertia>0.000654567,-6.39769e-005,5.5009e-009,-
    6.39769e-005,0.00247713,2.45835e-009,5.5009e-009,
    2.45835e-009,0.00235746</inertia>
<inertiaUnits>"kg*m^2"</inertiaUnits>
<volume>0.000101982</volume>
<volumeUnits>"m^3"</volumeUnits>
<surfaceArea>0.0722942</surfaceArea>
<surfaceAreaUnits>"m^2"</surfaceAreaUnits>
<frames>
    <Frame>
    <Frame>
    <Frame ref="13">
    <Frame ref="12">
</frames>
<geometryFileName>"robot-upperarm-1"</geometry-
    FileName>
</Body>
```

The exemplary XML file shown above includes information on the mass, inertia, volume and surface area of the upper arm 512 in the robot arm model. The XML file also includes geometry information of the upper arm 512, such as coordinate systems in the upper arm 512, in a <frames> element. The <frames> element may include multiple <Frame> elements each of which incorporates a coordinate system of the upper arm 512. The coordinate systems may include at least a center of gravity coordinate system in the upper arm 512. If joints or other components are connected to the upper arm 512, the upper arm 512 may have a coordinate system for each connection of the joints or other components. The <Frame> element may include a reference number that can be referenced to by joints or other components that are coupled to the upper arm 512. In the XML file for the upper arm 512, the upper arm 512 includes four <Frame> elements two of which have reference numbers "12" and "13", respectively. A joint that refers to the reference number "13" is described below in detail.

As shown above in the exemplary XML file for a <Body> element 831 in the <bodies> element 830, the XML file 130 may include a <geometryFileName> field for storing a file name of the graphical data object for the body. In the exemplary XML file, the body refers to the file named "robot-upperarm-1" among the files 550 shown in FIG. 5B. The referenced file may define the three-dimensional appearance of the body.

The <joints> element 840 may contain mates information between the rigid parts of the robot arm model. The information contained in the <joints> element 840 is used to build joint blocks in a block diagram modeling environment 140, which will be described in more detail below with reference to FIGS. 9 and 10. The <joints> element 830 includes multiple <SimpleJoint> elements 841 each of which may incorporate a mate or mates between two parts in the robot arm model. The multiple mates between two parts may be incorporated into one joint block in the block diagram modeling environment 140. A portion of an exemplary XML file for a <SimpleJoint> element 841 in the <joints> element 840 is provided as follows.

```
<SimpleJoint>
<name>"upperarm-1--forearm-1"</name>
<status>""</status>
<base>
    </JointSide>
        <name>""</name>
        <connection>
            <Frame ref="13"/>
        </connection>
    </JointSide>
    </base>
</follower>
    </JointSide>
        <name>""</name>
        </connection>
            <Frame ref="15"/>
        </connection>
    </JointSide>
</follower>
<primitives>
    <Primitive>
        <name>"revolute"</name>
        <referenceFrame>"WORLD"</referenceFrame>
        <axis>0,1,0</axis>
    </Primitive>
</primitives>
</SimpleJoint>
```

The <SimpleJoint> element 841 shown above includes information about mates between the upper arm 512 (base) and forearm 513 (follower) of the robot arm model. The information for the base and follower includes references to <Frame> elements in <Body> elements. In the exemplary portion of the XML format shown above, the base refers to Frame reference number "13", which is one of the <Frame> elements in the upper arm 512, as described above. The follower refers to Frame reference number "15", which may be one of the <Frame> elements in the forearm 513. The <SimpleJoint> element 841 of the XML file also includes information about primitives of a joint. The examples of the primitives may include a prismatic joint, a revolute joint, a spherical joint, weld, etc. The primitive joint expresses one degree of freedom (DoF) or coordinate of motion if the DoF is a translation along one direction (prismatic joint) or a rotation about one fixed axis (revolute joint). The spherical joint, which has three DoFs including two rotations to specify directional axis and one rotation about that axis, may be treated as a primitive in the illustrative embodiment of the present. A weld has no degree of freedom. Composite joints can be built up from these primitive joints. In the exemplary XML format shown above, the joint includes a Revolute primitive joint that has a rotation axis at [0 1 0].

The <subsystems> element 860 may contain information on the subassemblies of the main assembly in the robot arm model. The information contained in the <subsystems> element 860 is used to build subsystem blocks in a block diagram modeling environment 140. The <subsystems> element 860 may include multiple <Subsystem> elements 861 each of which may incorporate a subassembly of the robot model. Because the main assembly may be considered as a top level subassembly, a <Subsystem> element 861 may have same elements as the top level subsystem 820. Therefore, the XML file is organized to have the same structure as the hierarchy of the robot arm model.

Figure 9:
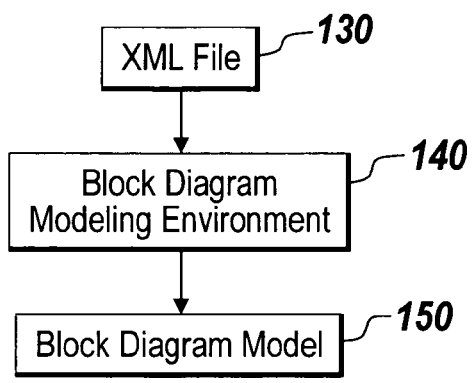
FIG. 9 depicts an illustrative embodiment of the present invention in which a block diagram modeling environment imports an XML format and builds a block diagram model from the XML format.
Figure 10:
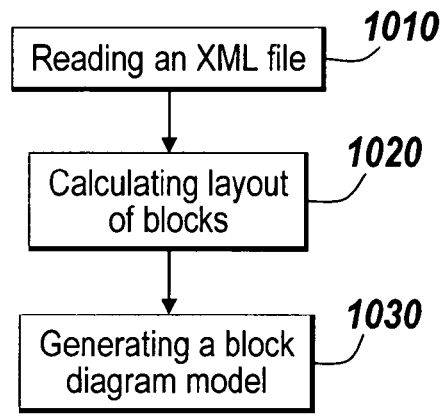
FIG. 10 is a flowchart illustrating an exemplary operation for importing an XML format and generating a block diagram model.

FIG. 9 depicts an illustrative embodiment of the present invention in which a block diagram modeling environment 140 builds up a block diagram model 150 from an XML file. In the block diagram modeling environment 140, users may input a command, such as a MATLAB® command import_physmod ('XML file name'), to import an XML file and build a model. In response to the command, the block diagram modeling environment 140 imports the XML file and builds a model based on the information contained in the XML file. FIG. 10 shows an exemplary operation for importing the XML file and generating a block diagram model. First, if the users input a command to import an XML file, the block diagram modeling environment 140 reads the XML file into the block diagram modeling environment 140. The block diagram modeling environment 140 parses the XML file and determines corresponding blocks based on the information contained in the XML file (step 1010). For example, the information contained in the <bodies> element 830 and <joints> element 840 may be parsed and used to build body blocks and joint blocks, respectively. Also, the information contained in the <grounds> element 850 and <subsystems> element 860 may be parsed and used to build ground blocks and subsystem blocks, respectively. After determining the corresponding blocks, the block diagram modeling environment 140 calculates the layout of the corresponding blocks (step 1020). One of ordinary skill in the art will appreciate that users may use graphical drawing tools, such as GraphViz from AT&T Labs, for drawing the layout of the blocks. The block diagram modeling environment 140 figures out where to place and how to orient the blocks in the model. After the block placement is calculated by the graphical drawing tools, ports within each of the blocks may be sorted to reduce the number of the connections between the blocks that cross over other connections. The placement information is used to orient the blocks and untangle the ports of the blocks. Finally, the block diagram modeling environment 140 actually instantiates the corresponding blocks and builds up a block diagram model from the XML file (step 1030).

Figure 11:
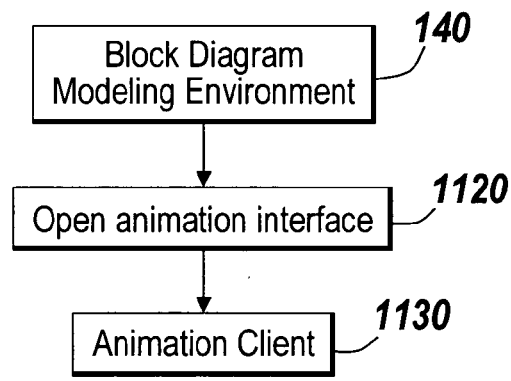
FIG. 11 is an exemplary interface between a block diagram modeling environment and animation clients in the illustrative embodiment of the present invention.
Figure 12:
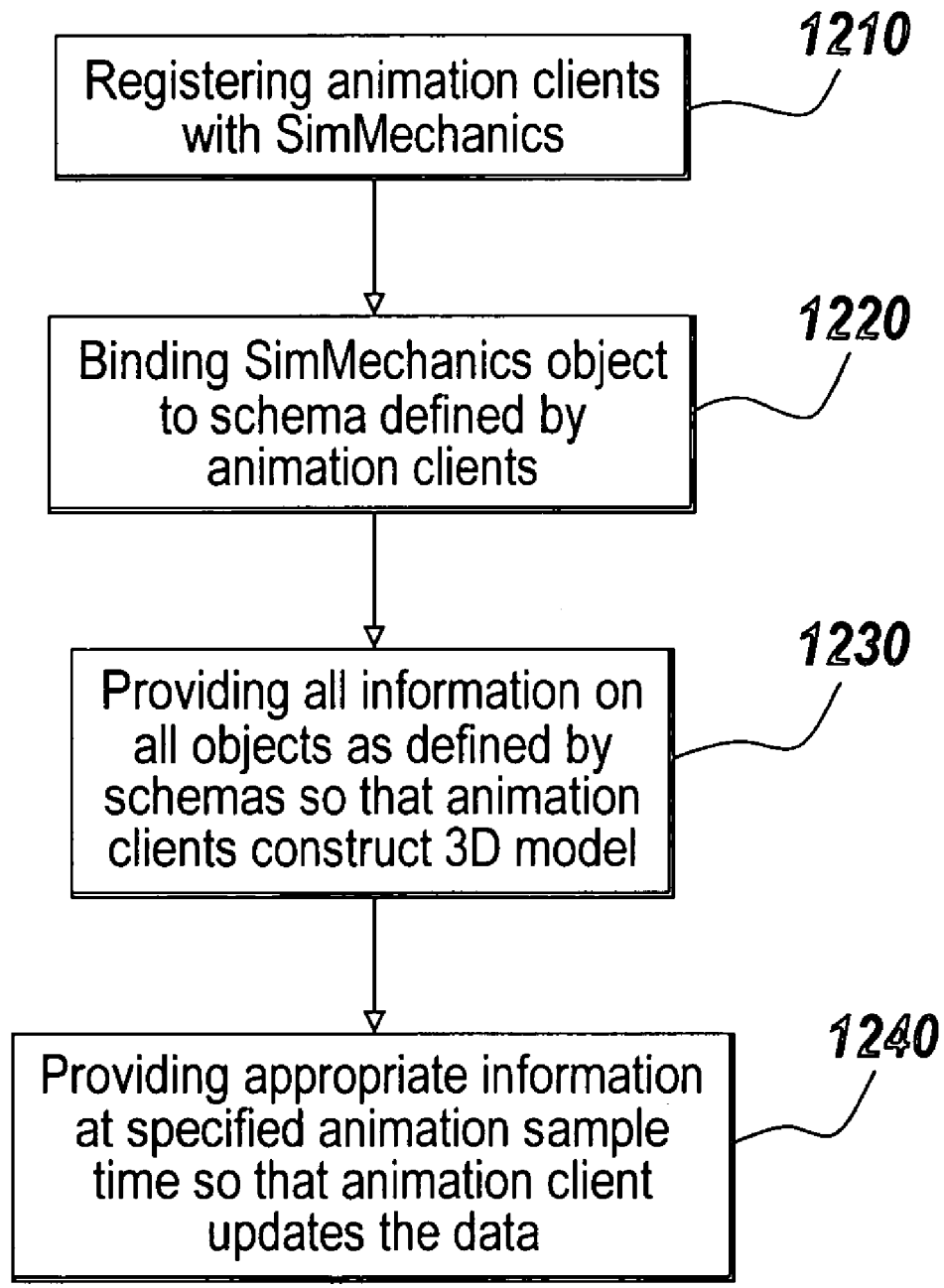
FIG. 12 is a flowchart showing an exemplary operation of the open interface depicted in FIG. 11.

The illustrative embodiment of the present invention provides animation of the models using animation clients. FIG. 11 shows an exemplary interface between a block diagram modeling environment and animation clients. The animation clients 1130 provides three-dimensional graphics environment for the animation of the block diagram models. Each of the animation clients 1130 requires different data format, or schema, for constructing the three-dimensional model. The illustrative embodiment of the present invention provides an open animation interface for the block diagram modeling environment 140 that can support multiple animation clients 1130 at a simultaneous time. FIG. 12 shows an exemplary operation of the open interface 1120 between the block diagram modeling environment 140 and the animation clients 1130. Using a registration API, animation clients 1130 register themselves with the block diagram modeling environment 140 (step 1210). During registration, each animation client defines a schema for each animated object and a fixed set of animation routines for the block diagram modeling environment 140. The registered schemas represent data format required for animation of applicable objects. All applicable objects are bounded to the schemas defined during registration (step 1220). Each schema is instantiated for each applicable object and applicable data is automatically generated or supplied by users. If simulation begins, each of the animation clients 1130 is notified via the registered animation routines and passed all information about all objects as defined by the registered schemas (step 1230). The animation client constructs an appropriate three-dimensional model and prepares for animation. At each time step, the block diagram modeling environment 140 passes appropriate information to each animation client subject to specified animation sample time (step 1240). Each animation client uses the data to update itself appropriately. One of ordinary skill in the art will appreciate that the open animation interface may support animation while simulation is running on an external client.

In summary, the illustrative embodiment of the present invention exports a CAD model 120 into an XML file. One of ordinary skill in the art will appreciate that the CAD model 120 is an illustrative model and any other models may be exported into the XML file. One of ordinary skill in the art will also appreciate that the XML file is an illustrative format and any other markup language format may be used in other embodiments. The XML file is imported into a block diagram modeling environment 140 in which a corresponding block diagram model 150 is built up using the information contained in the XML file. The block diagram model 150 may be used for designing a control system for the CAD model 120. The block diagram model 150 may also be used for the dynamic simulation of the CAD model 120. In the simulation of the CAD model 120 in the block diagram modeling environment 140, animation is provided by animation clients 1130 via open animation interfaces 1120. The open animation interfaces 1120 support multiple animation clients 1130 at a simultaneous time. One of ordinary skill in the art will appreciate that the block diagram modeling environment 140 is an illustrative modeling environment that imports the XML file and the XML file may be imported into any other modeling environments and can be used to build models in those modeling environments.

It will thus be seen that the invention attains the objectives stated in the previous description. Since geometric changes may be made without departing from the scope of the present invention, it is intended that all matter contained in the above description or shown in the accompanying drawings be interpreted as illustrative and not in a literal sense. For example, the illustrative embodiment of the present invention may be practiced with any geometric model that provides geometric representation of physical objects. Practitioners of the art will realize that the sequence of steps and architectures depicted in the figures may be altered without departing from the scope of the present invention and that the illustrations contained herein are singular examples of a multitude of possible depictions of the present invention.

We claim:

1. A method for translating a first model generated in a different modeling environment into a second model in a block diagram modeling environment, the method comprising:

importing a neutral data format into the block diagram modeling environment, wherein the neutral data format comprises information relating to rigid parts of the first model and information relating to mates between the rigid parts of the first model; wherein importing comprises:

reading the neutral data format to extract the information relating to the rigid parts of the first model and information relating to the mates between the rigid parts of the first model;

creating blocks comprising connection ports in the second model based on the information relating to the rigid parts of the first model and information relating to the mates between the rigid parts of the first model;

calculating a layout of the blocks and of the connection ports to reduce crossing of connection lines between the blocks; and generating a block diagram model based on the data contained in the neutral data format.

2. The method of claim 1 wherein the different modeling environment includes a Computer Aided Design (CAD) modeling environment.

3. The method of claim 1 wherein the neutral data format is Extensible Markup Language (XML) compatible.

4. The method of claim 1 wherein the step of creating comprises:

creating body blocks in the second model based on the information relating to the rigid parts of the first model or creating joint blocks in the second model based on the information relating to the mates between the rigid parts of the model.

5. The method of claim 1 wherein the step of calculating comprises:

sorting ports within each of the blocks of the second model to reduce a number of connection lines between the blocks that cross over other connection lines.

* * * * *

UNITED STATES PATENT AND TRADEMARK OFFICE
CERTIFICATE OF CORRECTION

PATENT NO. : 7,292,964 B1
APPLICATION NO. : 10/744513
DATED : November 6, 2007
INVENTOR(S) : Mukherjee et al.

It is certified that error appears in the above-identified patent and that said Letters Patent is hereby corrected as shown below:

Column 4, line 20 should read:
--less, those who are skilled in the art will appreciate that the--

Column 6, line 14 should read:
--~~ordinary~~ art will appreciate that the neutral data format 130--

Column 7, line 4 should read:
--neutral data format 130, and code 253 for the ~~a~~ block--

Column 7, line 19 should read:
--reference to FIGS. 4 through 8[.]--

Column 8, line 31 should read:
--parts may include but are not limited to mass, inertial, volume--

Column 8, line 63 should read:
--and a model name [(]see FIG. 8). The XML file includes a top--

Column 10, line 10 should read:
--<[[/]]JointSide>--

Column 10, line 17 should read:
--<[[/]]follower>--

Column 10, line 18 should read:
--<[[/]]JointSide>--

UNITED STATES PATENT AND TRADEMARK OFFICE
CERTIFICATE OF CORRECTION

PATENT NO. : 7,292,964 B1
APPLICATION NO. : 10/744513
DATED : November 6, 2007
INVENTOR(S) : Mukherjee et al.

It is certified that error appears in the above-identified patent and that said Letters Patent is hereby corrected as shown below:

Column 10, line 20 should read:
--<[[/]]connection>--

Signed and Sealed this

Fifteenth Day of April, 2008

JON W. DUDAS
*Director of the United States Patent and Trademark Office*